United States Patent
Dasylva et al.

(10) Patent No.: US 6,999,682 B2
(45) Date of Patent: Feb. 14, 2006

(54) TECHNIQUE FOR OPTICALLY CONVERTING WAVELENGTHS IN A MULTI-WAVELENGTH SYSTEM

(75) Inventors: Abel C. Dasylva, Ottawa (CA); Delfin Y. Montuno, Kanata (CA); Guo-Qiang Wang, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 682 days.

(21) Appl. No.: 09/750,304

(22) Filed: Dec. 29, 2000

(65) Prior Publication Data

US 2002/0118415 A1 Aug. 29, 2002

(51) Int. Cl.
*H04B 10/00* (2006.01)

(52) U.S. Cl. .......................... 398/79; 398/46
(58) Field of Classification Search ............ 398/43–57, 398/79–103; 370/351, 480, 481
See application file for complete search history.

(56) References Cited

U.S. PATENT DOCUMENTS 5,822,476 A * 10/1998 Jopson .................. 385/27

OTHER PUBLICATIONS

Ramamurthy, B. Wavelength Conversion in WDM Networking, Sep. 1998, vol. 16, 1061-1073.*

S. Yoo, "Wavelength-conversion technologies for WDM network applications", IEEE Journal of Lightwave Technology, vol. 14, pp. 955-966, Jun. 1996.
B. Ramamurthy, and B. Mukherjee, "Wavelength-conversion in WDM networking", IEEE Journal on Selected Areas on Communications, vol. 16, pp. 1061-1073, Sep. 1998.
N. Antoniades, S. Yoo, K. Bala, G Ellinas, and T Stern, "An architecture for a wavelength-interchanging cross-connect utilizing parametric wavelength-converters", IEEE Journal of Lightwave Technology, vol. 17, pp. 113-1125, Jul. 1999.
K. Lee, and V. Li, "A wavelength-convertible optical network" IEEE Journal of Lightwave Technology, vol. 11, pp. 962-970, May-Jun. 1993.
R. Thompson, and D. Hunter, "Elementary photonic switching modules in three divisions", IEEE Journal on Selected Areas in Communications, vol. 14, pp. 362-373, Feb. 1996.

* cited by examiner

*Primary Examiner*—Agustin Bello
(74) *Attorney, Agent, or Firm*—Hunton & Williams LLP

(57) ABSTRACT

A technique for optically converting wavelengths in a multi-wavelength system is disclosed. In one embodiment, wherein the multi-wavelength system has W wavelength channels, wherein $W=2^N$, the technique is realized by selectively directing a received frequency channel corresponding to a respective wavelength channel based upon a predetermined frequency mapping. Then, the frequency of the selectively directed frequency channel is shifted at least once by an amount defined by $\pm 2^i \Delta f$, wherein $\Delta f$ is the frequency spacing between adjacent frequency channels, and $i = 0, 1, \ldots N-1$.

24 Claims, 17 Drawing Sheets

Difference-frequency generation

TECHNIQUE FOR OPTICALLY CONVERTING WAVELENGTHS IN A MULTI-WAVELENGTH SYSTEM

CROSS-REFERENCE TO RELATED APPLICATIONS

This patent application is related to U.S. patent application Ser. No. 09/750,316 (Client Reference No. 12922RO), filed concurrently with this patent application, and which is hereby incorporated by reference herein in its entirety.

This patent application is also related to U.S. patent application Ser. No. 09/749,946 (Client Reference No. 12946RO), filed concurrently with this patent application, and which is hereby incorporated by reference herein in its entirety.

FIELD OF THE INVENTION

The present invention relates generally to optical wavelength conversion and, more particularly, to a technique for optically converting wavelengths in a multi-wavelength system.

BACKGROUND OF THE INVENTION

All-optical wavelength conversion is an important feature of multi-wavelength optical systems such as wavelength-switching networks. Solutions to provide all-optical wavelength conversion have been studied to a great extent in the context of wavelength-switching, because they simplify network management, and provide superior blocking performance (see B. Ramamurthy and B. Mukherjee, "Wavelength-conversion in WDM networking", IEEE Journal on Selected Areas on Communications, vol. 16, pages 1061–1073, September 1998). These solutions comprise hardware designs for elementary converters (see S. Yoo, "Wavelength-conversion technologies for WDM network applications", IEEE Journal of Lightwave Technology, vol. 14, pages 955–966, June 1996; J. Elmirghani and H. Mouftah, "All-optical wavelength conversion: technologies and applications in DWDM networks", IEEE Communications Magazine, pages 86–92, March 2000), as well as techniques to make the best use of limited wavelength conversion resources. Several hardware designs are possible for all-optical wavelength conversion, which include cross-gain or cross-phase modulation in semiconductor optical amplifiers, as well as wave-mixing techniques based on nonlinear media. The devices resulting from these different techniques have diverging characteristics in terms of their transparency, their bandwidth, and their bulk wavelength conversion capability. For example, devices based on cross-gain modulation provide limited signal transparency and have no bulk wavelength conversion ability, as they only accept one input signal at any time. On the other hand, these devices have a mature manufacturing process. They have been commercially available for several years. Wave-mixing converters are more recent but offer many advantages, such as a high signal transparency and bulk wavelength conversion capabilities. Yet their manufacturing processes are still immature. In general, all-optical wavelength converters remain expensive. Therefore, we need to minimize requirements for such devices in any multi-wavelength system.

The above mentioned evolution has constrained previous solutions to using converters with no bulk wavelength conversion capacity, like the ones based on cross-gain modulation. Converters with no bulk wavelength conversion capability, which are also called single-input converters, offer few options to provide wavelength conversions in multi-wavelength systems. The solutions are limited to mapping each input frequency to its image by an atomic wavelength conversion, which is implemented with dedicated converters. This technique enables the building of strictly non-blocking multi-wavelength optical cross-connects (see B. Ramamurthy et al. referenced above). However, it produces high converter costs, as the number of all-optical converters is O(F.W), where W is the number of wavelengths and F is the number of fibers.

The development of wave-mixing converters has motivated new techniques for wavelength conversion. Some of these solutions reduce converter requirements by exploiting bulk wavelength conversion inherent in wave-mixing (see N. Antoniades, S. Yoo, K. Bala, G. Ellinas, and T. Stern, "An architecture for a wavelength-interchanging cross-connect utilizing parametric wavelength-converters", IEEE Journal of Lightwave Technology, vol. 17, pages 113–1125, July 1999). In such architectures, input frequencies are usually converted to their image, through a cascade of elementary wavelength conversions. These conversions follow parametric relationships characterizing the type of wave-mixing converter used (see S. Yoo referenced above). For example, in the case of converters based on difference-frequency generation, each input frequency f is mapped to $f^p - f$, where $f^p$ is the pump frequency of the converter. For example, rearrangeable wavelength-interchanging cross-connects have been proposed that are based on a modified Benes interconnection topology (see N. Antoniades et al. referenced above). However, these techniques do not lead to any dramatic reduction of converter requirements. Indeed, the most efficient technique described so far still uses a number of wave-mixing converters, of the order of the number of wavelengths, per fiber (see N. Antoniades et al. referenced above). Most previous work focuses on the design of all-optical wavelength switches that have the capability to provide dynamic mappings between incoming wavelengths and outgoing wavelengths. Yet few studies consider the problem of the all-optical implementation of static frequency mappings. Such mappings have an important role in all-optical signal processing.

In view of the foregoing, it would be desirable to provide a technique for optically converting wavelengths in a multi-wavelength system in an efficient and cost effective manner which overcomes the above-described inadequacies and shortcomings.

SUMMARY OF THE INVENTION

According to the present invention, a technique for optically converting wavelengths in a multi-wavelength system is provided. In one embodiment, wherein the multi-wavelength system has W wavelength channels, wherein $W=2^N$, the technique is realized by selectively directing a received frequency channel corresponding to a respective wavelength channel based upon a predetermined frequency mapping. Then, the frequency of the selectively directed frequency channel is shifted at least once by an amount defined by $\pm 2^i \Delta f$, wherein $\Delta f$ is the frequency spacing between adjacent frequency channels, and $i=0, 1, \ldots N-1$.

In accordance with other aspects of the present invention, wavelength channel ordering may be preserved by only shifting the frequency of the selectively directed frequency channel to a higher frequency. Moreover, the shifting of the frequency of the selectively directed frequency channel may be constrained such that the frequency of the selectively directed frequency channel is shifted at least once by an amount defined by $+2^{N-1-i}\Delta f$. Alternatively, the shifting of the frequency of the selectively directed frequency channel may be further constrained such that the frequency of the selectively directed frequency channel is shifted at least once by an amount defined by $2^{N-1-\lfloor \log_2 \kappa \rfloor - i}$, wherein $\kappa$ is an integer and i=0, ..., $N-1-\lfloor \log_2 \kappa \rfloor$. It is noted that the amount by which the frequency of the selectively directed frequency channel is shifted beneficially decreases as the number of times the frequency of the selectively directed frequency channel is shifted increases.

In accordance with further aspects of the present invention, wavelength channel ordering may be preserved by only shifting the frequency of the selectively directed frequency channel to a lower frequency. Moreover, the shifting of the frequency of the selectively directed frequency channel may be constrained such that the frequency of the selectively directed frequency channel is shifted at least once by an amount defined by $-2^i \Delta f$. Alternatively, the shifting of the frequency of the selectively directed frequency channel may be further constrained such that the frequency of the selectively directed frequency channel is shifted at least once by an amount defined by $-2^i \kappa \Delta f$, wherein $\kappa$ is an integer and i=0, ..., $N-1-\lfloor \log_2 \kappa \rfloor$. Again, it is noted that the amount by which the frequency of the selectively directed frequency channel is shifted beneficially decreases as the number of times the frequency of the selectively directed frequency channel is shifted increases.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
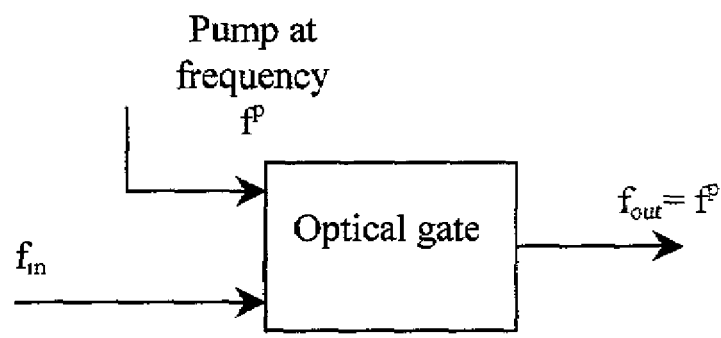
FIG. 1 shows an exemplary prior art optical-gating wavelength converter.

The present invention provides cost effective techniques to implement static frequency-mappings, in an all-optical manner, with wave-mixing converters. The main idea behind the present invention is to decompose the mapping of each frequency f to its image $\Gamma(f)$, into a cascade of elementary frequency translations by amounts of the form $\pm 2^i \cdot \Delta f$, where $\Delta f$ is the frequency spacing between adjacent frequency channels. In other words, for some frequency f and the binary representation of $$\frac{1}{\Delta f} \cdot (\Gamma(f) - f)$$

given by $$\left( \sum_{i=0}^{N-1} 2^i \cdot b_i \right),$$

where $b_i \in \{0,1\}$, the present invention comprises converting f into $\Gamma(f)$ with a sequence of frequency translations by $2^i \cdot \Delta f$, where l=0,1, . . . , N−1. In a system with $W=2^N$ frequencies of the form $f_i=f_0+i.\Delta f$, having the constraint that each input frequency is mapped to some other frequency of the available spectrum, the present invention approach reduces the required number of wave-mixing converters to $O(\log_2 W)$. This roughly corresponds to one $\pm 2^i.\Delta f$ frequency shifter for each value of i, where i=0,1, . . . , N−1. To implement this approach in the most general way, a generic logarithmic converter design, or generic log-converter, is disclosed where a central wavelength-selective cross-connect connects peripheral frequency translation modules, and the size of the central cross-connect is of the order of $O(W.(\log_2 W)^2 \log(W.(\log_2 W)^2))$. The advantage of generic logarithmic converters is to allow individual frequencies to visit the different frequency translation modules in any arbitrary order. In spite of the flexibility that they offer, the spatial complexity of generic logarithmic converters may be high due to the presence of the central wavelength-selective cross-connect. Indeed, the spatial complexity of the wavelength-selective cross-connect is at least $O(W.(\log_2 W)^2 \log(W.(\log_2 W)^2))$, and it becomes quite large when the number of frequency channels increases. For this reason, the present invention also discloses another form of logarithmic converters, with a linear multi-stage structure, which are called priority-based logarithmic converters, or priority log-converters. In these converters, each stage contains two paths. The first path leads to a wave-mixing frequency shifter that provides a discrete frequency translation by $\pm 2^i.\Delta f$ to each input frequency into the stage, while the other path bypasses the frequency shifter and leads directly to the next stage.

The number of stages of a priority log-converter is $O(\log_2 W)$. Priority log-converters owe their names to the fact each input frequency visits the frequency shifting modules in some predetermined order. Priority log-converters are interesting because they can be implemented with a smaller spatial complexity than other solutions, which are based on a central wavelength-selective cross-connect. However, these multi-stage converters offer less flexibility for wavelength assignments than generic log-converters do. An interesting result is that in spite of their constrained design, priority log-converters perform as well as generic log-converters for certain important mappings. Regardless of the type of log-converter, a common requirement to use these converters is to ensure that no frequency collision occurs within any frequency translation module (i.e., the frequencies assigned to any frequency shifting module must always be distinct). The problem is a particular instance of the widely studied routing and wavelength assignment problem (see B. Ramamurthy et al. referenced above). In wavelength-switched networks, the general routing and wavelength assignment problem consists of selecting routes and assigning wavelengths on the selected routes to meet a given traffic demand, while avoiding any frequency collision on any network link, and while taking into account wavelength continuity constraints. In its general form, the routing and wavelength assignment problem is difficult (see B. Ramamurthy et al. referenced above). In the case of a log-converter, the problem reduces to finding the right order to assign the different input frequencies to the available frequency shifters. In spite of this simplification, the problem remains fairly open, even when there is no additional constraint on the frequency mapping. However, the present invention involves identifying specific frequency mappings, with special properties that enable simple solutions to be found.

Interesting frequency mappings are pseudo frequency-multiplications and pseudo frequency-divisions. A pseudo frequency multiplication or division converts any frequency $f_i=f_0+i.\Delta f$ to $f_{k.i}=f_0+k.i.\Delta f$, where k is the scaling factor of the mapping. The factor k is larger than 1 in the case of a pseudo frequency multiplication, but it is smaller than 1 in the case of a pseudo frequency division. For example, in the case of a dedicated converter solution for an all-optical pseudo frequency multiplier by k, as many as W/k such converters are needed. Fortunately, in addition to their monotonicity properties, pseudo frequency multiplications or divisions satisfy another interesting property. The property is that for any pseudo frequency multiplication (or division) $\Gamma$, the mapping $\Gamma'(f)=\Gamma(f)-f$ (or $\Gamma'(f)=f-\Gamma(f)$) is increasing. All these special properties enable the routing and wavelength assignment problem to be efficiently solved.

To provide a broad treatment of the problem, a general class of frequency mappings are introduced, which are called constrained increasing frequency mappings. This class includes pseudo frequency multipliers or dividers. Briefly, a constrained increasing frequency mapping $\Gamma$ preserves the frequency ordering of the input channels, and is such that the mapping $\Gamma'(f)=|\Gamma(f)-f|$ is also increasing. In the following discussions, two basic types of constrained increasing converters are identified as follows:

1.) Constrained increasing up-converter: when each input frequency is smaller than its image; and
2.) Constrained increasing down-converter: when each input frequency is larger than its image.

The present invention provides a design based on priority log-converters, where the assignments of precedence to the different frequency translation modules is appropriate. The key idea is to assign the precedence in the same order as the magnitude of frequency shifts of the different modules. Independently of the monotonicity properties of a given mapping $\Gamma$, it is possible to further reduce converter requirements when the mapping $\Gamma'(f)=|\Gamma(f)-f|$ is some multiple of $\kappa.\Delta f$ for all frequencies in the input frequency set (i.e., the set of frequencies to be converted by the constrained increasing mapping), where $\kappa$ is some integer constant characteristic of the mapping.

I. Elementary Wavelength Converters

There are two major types of wavelength converters. The first type is based on optical gating, while the second type is based on wave-mixing in nonlinear media (see S. Yoo referenced above).

A. Optical Gating Converters

Optical-gating converters include converters using cross-gain modulation in semiconductor optical amplifiers (see S. Yoo referenced above). They operate by translating signals carried on some input frequency to another frequency, in the saturation regime of semiconductor optical amplifiers. These converters can only convert one input frequency at a time. However, they can map different input frequencies to the same frequency (frequency of the pump). Referring to FIG. 1, there is shown an exemplary optical-gating wavelength converter 10 for translating an input signal carried on an input frequency, $f_{in}$, to an output signal carried on a pump frequency $f_{out}=f^p$.

B. Wave-Mixing Converters

Figure 2:
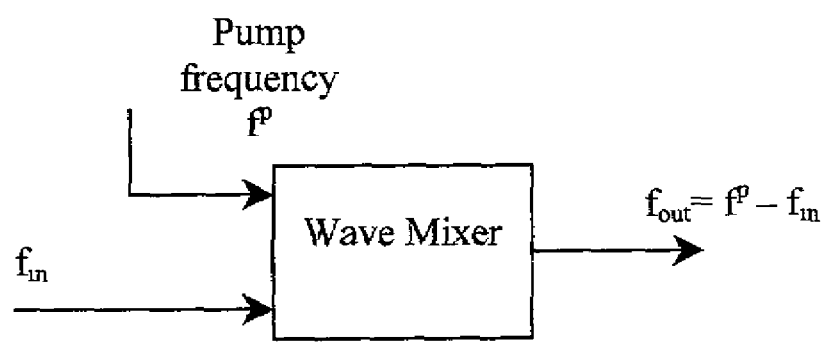
FIG. 2 shows a prior art wave-mixing wavelength converter based on difference frequency generation.

Wave-mixing converters exploit nonlinear effects in appropriate medias such as optical fibers or semiconductor optical amplifiers. A variety of nonlinear effects exist including difference frequency generation and four wave-mixing (see S. Yoo referenced above). Converters of this type usually have a precise parametric relationship between the incoming frequencies, the pump and the outgoing frequencies. In the case of difference frequency generation with some pump frequency $f^p$, an input frequency f is mapped to the output frequency $f^p$–f (see FIG. 2, which shows a wave-mixing wavelength converter 20 based on difference frequency generation). Major advantages of wave-mixing converters are their high level of transparency and their ability to simultaneously convert several input frequencies.

C. Elementary Converters

For purposes of this detailed description, an elementary converter may be any device that falls within one of the categories described below:

1.) The device maps any input frequency f to $f^p$–f, where $f^p$ is some pump frequency, and it can accept several distinct input frequencies;
2.) The device maps any input frequency f to f+Δ, where Δ is some frequency shift characteristic of the device; or
3.) The device maps any input frequency f to $f^p$, where $f^p$ is some pump frequency.

Figure 3:
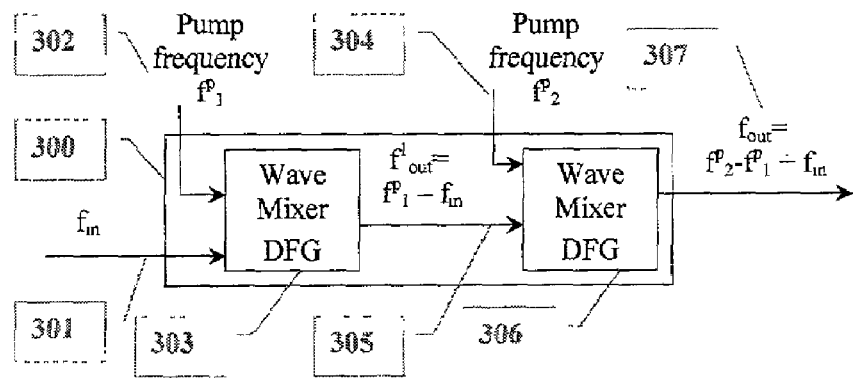
FIG. 3 shows a prior art elementary converter wherein frequency translation is implemented with two cascaded difference frequency wave-mixing devices.

Referring to FIG. 3, there is shown an elementary converter 300 of the second category above wherein frequency translation is implemented with two cascaded difference frequency wave-mixing devices. That is, elementary converter 300 comprises two cascaded difference frequency wave-mixers 303 and 306 driven by different pump frequencies 302 and 304. Outgoing frequencies 307 are the result of the translation of incoming frequencies 301 by an amount equal to the difference of the pump frequencies in the second and the first wave-mixing devices.

II. Background on Mappings

For purposes of this detailed description, a few basic definitions about mappings in general are provided.

A mapping Γ is a relationship between elements of an input set $\Phi_{in}$ and elements of an output set $\Phi_{out}$. It associates each element x of $\Phi_{in}$ to one and only one element y=Γ(x) of $\Phi_{out}$. Assuming that the input and output sets contain real numbers, the mapping Γ is non-decreasing (or non-increasing) if for any elements $x_1$ and $x_2$ of $\Phi_{in}$, such that $x_1 \leq x_2$, we have $\Gamma(x_1) \leq \Gamma(x_2)$ (or $\Gamma(x_1) \geq \Gamma(x_2)$). The mapping Γ is increasing (or decreasing) if for any elements $x_1$ and $x_2$ of $\Phi_{in}$, such that $x_1 < x_2$, we have $\Gamma(x_1) < \Gamma(x_2)$ (or $\Gamma(x_1) > \Gamma(x_2)$).

III. Previous Designs for Pseudo-Frequency Multipliers or Dividers

Figure 4:
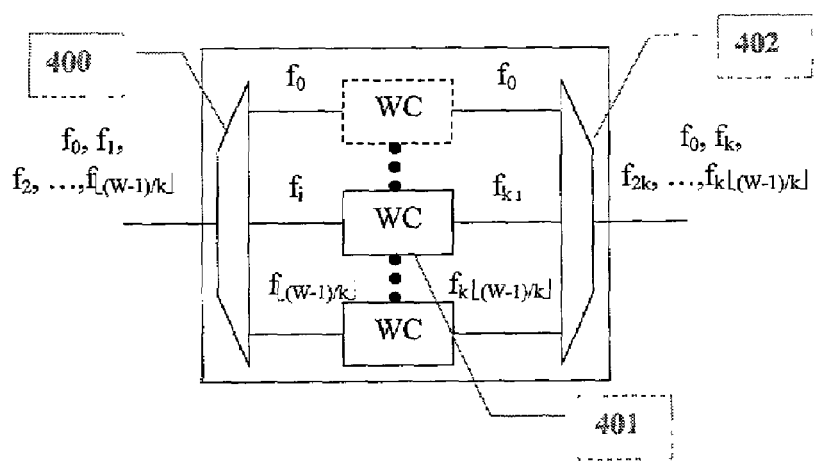
FIG. 4 shows an all-optical pseudo frequency multiplier built with dedicated wavelength converters in accordance with the present invention.

Referring to FIG. 4, there is shown an all-optical pseudo frequency multiplier built with dedicated wavelength converters (WCs). The all-optical pseudo frequency multiplier is a multi-wavelength system operating on frequencies of the form $f_0$+i.Δf, where i=0, ..., W–1, and W=$2^N$. For some integer k, the pseudo frequency multiplier by k maps each frequency $f_i$ to $f_{k.i}$, where k.i≤W–1. To implement the mapping, $$\left\lceil \frac{W-1}{k} \right\rceil$$

converters are used which are dedicated to each of the frequencies $f_i$, wherein k.i≤W–1. The input frequencies are demultiplexed by the wavelength demultiplexer 400 and sent to dedicated wavelength converters (WCs) 401. In the case of $f_0$, there is no need for any wavelength converter, since the frequency is not to be changed. The converted frequencies are then multiplexed into the output of the pseudo-multiplier by the multiplexer 402. The dedicated wavelength converters (WCs) 401 may be implemented by cross-gain or cross-phase modulation in semiconductor optical amplifiers.

Figure 5:
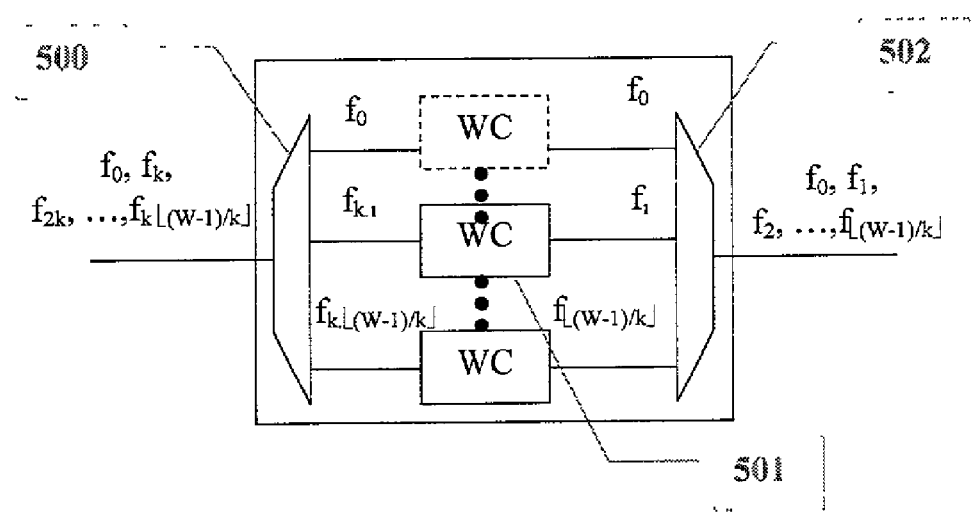
FIG. 5 shows an all-optical pseudo frequency divider built with dedicated wavelength converters in accordance with the present invention.

Similarly, a pseudo frequency divider by k may be implemented that maps each incoming frequency $f_{k.i}$ to $f_i$, with $$\left\lceil \frac{W-1}{k} \right\rceil$$

converters which are dedicated to each of the channels $f_{k.i}$. For example, referring to FIG. 5, there is shown an all-optical pseudo frequency divider built with dedicated wavelength converters (WCs). The design of FIG. 5 is essentially obtained by reversing the design of FIG. 4. That is, a wavelength demultiplexer 500 separates the different input frequencies, and sends each of them to a dedicated wavelength converter (WC) 501. These wavelength converters (WCs) 501 perform the inverse wavelength conversions of the wavelength converters (WCs) 401 in FIG. 4. Then the converted frequencies are sent to a multiplexer 502.

In the designs of both FIG. 4 and 5, a number of elementary wavelength converters of the order of O(W/k) are used. Thus, the requirements are difficult to meet when several hundreds of frequencies are in the system.

IV. Logarithmic Converters

For purposes of this detailed description, a multi-wavelength system carrying frequencies of the form $f_0$+i.Δf, where i=0, ..., W–1, and W=$2^N$ is assumed. The goal is to implement some frequency mapping Γ, from a subset $\Phi_{in}$ into another frequency subset $\Phi_{out}$, where both subsets are included in the spectrum of the multi-wavelength system. If it is assumed that some frequency is always mapped to another larger (or smaller) frequency, each frequency may be converted to its image by performing cascaded frequency translations in amount of the type $2^i \Delta f$ (or $-2^i \Delta f$), where i=0,1, ..., N–1. To illustrate this point, consider the example where W=8, $\Phi_{in}$={$f_0, f_1, f_2, f_3$}, $\Phi_{out}$={$f_0, f_2, f_4, f_6$} and the mapping Γ is defined as follows:

$\Gamma(f_0)=f_0$      1.)

$\Gamma(f_1)=f_2$      2.)

$\Gamma(f_2)=f_4$      3.)

$\Gamma(f_3)=f_6$      4.)

Then, the following equations are obtained:

$\Gamma(f_0)=f_0$      1.)

$\Gamma(f_1)=f_1+\Delta f$      2.)

$\Gamma(f_2)=f_2+2.\Delta f$      3.)

$\Gamma(f_3)=f_3+\Delta f+2.\Delta f$      4.)

In the above example, Γ(f)–f is decomposed into elementary frequency translations by $2^i \Delta f$, where i=0,1, ..., N–1. For each input frequency f, the general technique is to decompose Γ(f)–f by mapping the integer $$\frac{1}{\Delta f} \cdot (\Gamma(f) - f)$$

to its binary representation. In the present invention approach, a single frequency shifter by an amount of $\pm 2^i \Delta f$ for each i=0,1, . . . , N−1 is provided. This frequency shifter is shared among all the frequencies of $\Phi_{in}$ that must be shifted by the corresponding amount. The most generic way to implement this technique uses a central wavelength-selective cross-connect that enables any input frequency f to visit the frequency shifters identified by the binary representation of $$\left| \frac{\Gamma(f) - f}{\Delta f} \right|$$

in any order. Since in the present invention approach there are $O(\log_2 W)$ elementary shared wavelength converters, the new circuits are called logarithmic converters, or log-converters.

A. Generic Log-Converters

Figure 6:
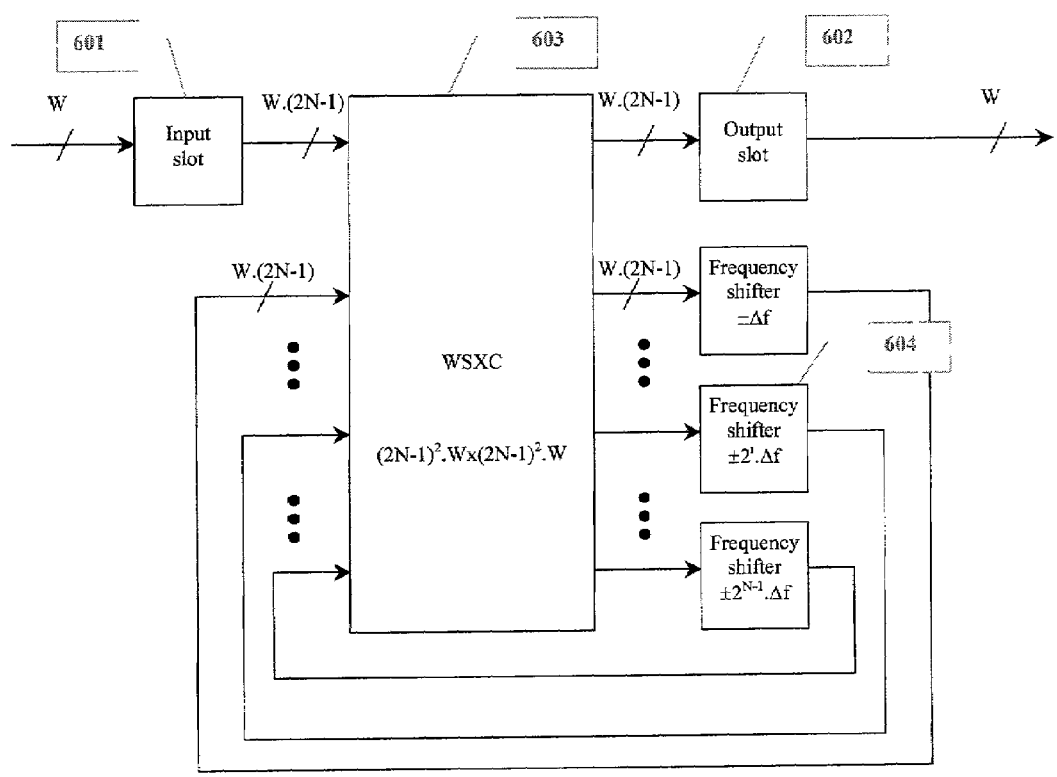
FIG. 6 shows the general design of a logarithmic multistage wavelength converter based on frequency shifters in accordance with the present invention.

The general design for a logarithmic multistage wavelength converter based on frequency shifters is shown in FIG. 6. The overall converter comprises an input slot 601 that receives input frequencies and directs them to a proper frequency shifting module 604 through a central wavelength selective cross-connect (WSXC) 603. An output slot 602 receives the converted frequencies and directs them to an output. For each i=0, . . . , N−1, the design uses a single frequency shifting module 604 that provides a frequency translation by $+2^i \cdot \Delta f$ (or $-2^i \cdot \Delta f$). To implement a frequency mapping with the architecture based on a central wavelength-selective cross-connect, for each input frequency a permutation of the frequency shifters to which it is assigned, must be selected such that the frequencies sent to any frequency shifter are always distinct. When a frequency is not allowed to use the same frequency shifting module more than once, there may be as many as (2N−2)! different possible routes between the input slot and the output slot, for a given input frequency. Overall, an instance of the well-known routing and wavelength assignment problem is obtained (see B. Ramamurthy referenced above). In general, the problem is difficult, and cannot be solved in polynomial time. However, several heuristics exist to compute approximate solutions (see B. Ramamurthy referenced above). In the case of the present invention, these heuristics may enable routes to be found for the different input frequencies, such that no frequency collision occurs in the logarithmic wavelength converter.

Figure 7:
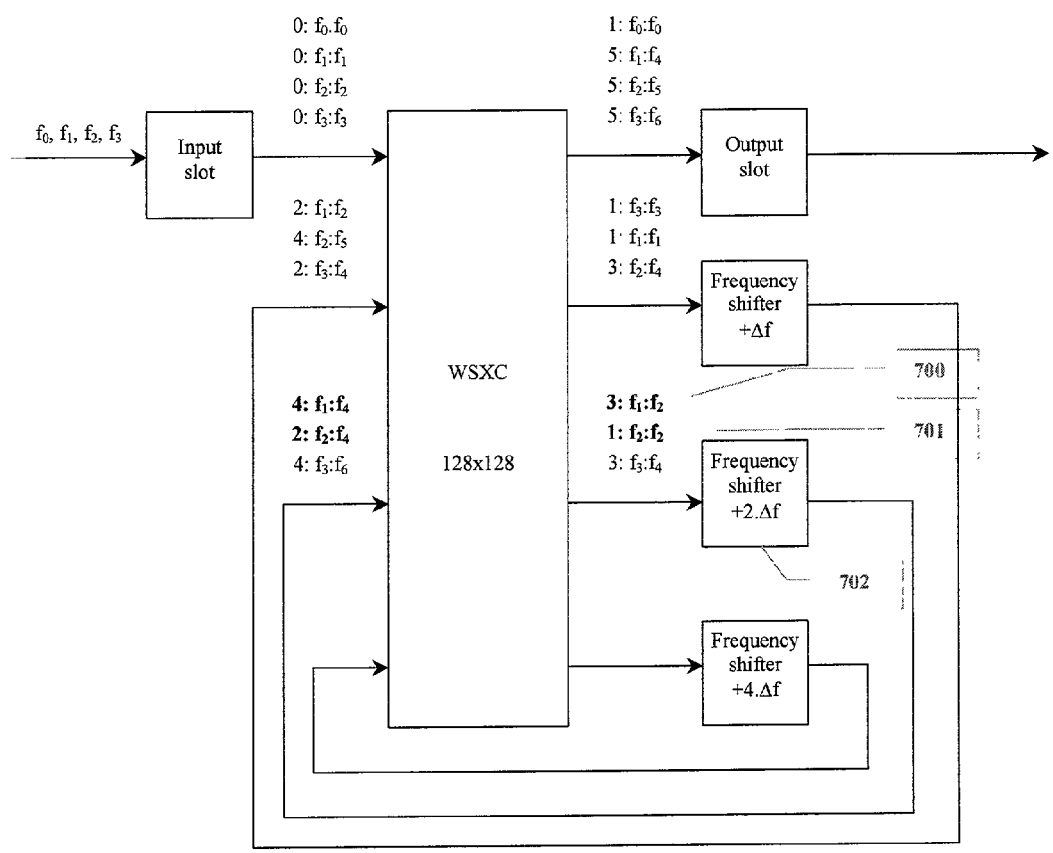
FIG. 7 shows a routing and wavelength assignment solution with collision for the logarithmic multistage wavelength converter of FIG. 6 in accordance with the present invention.
Figure 8:
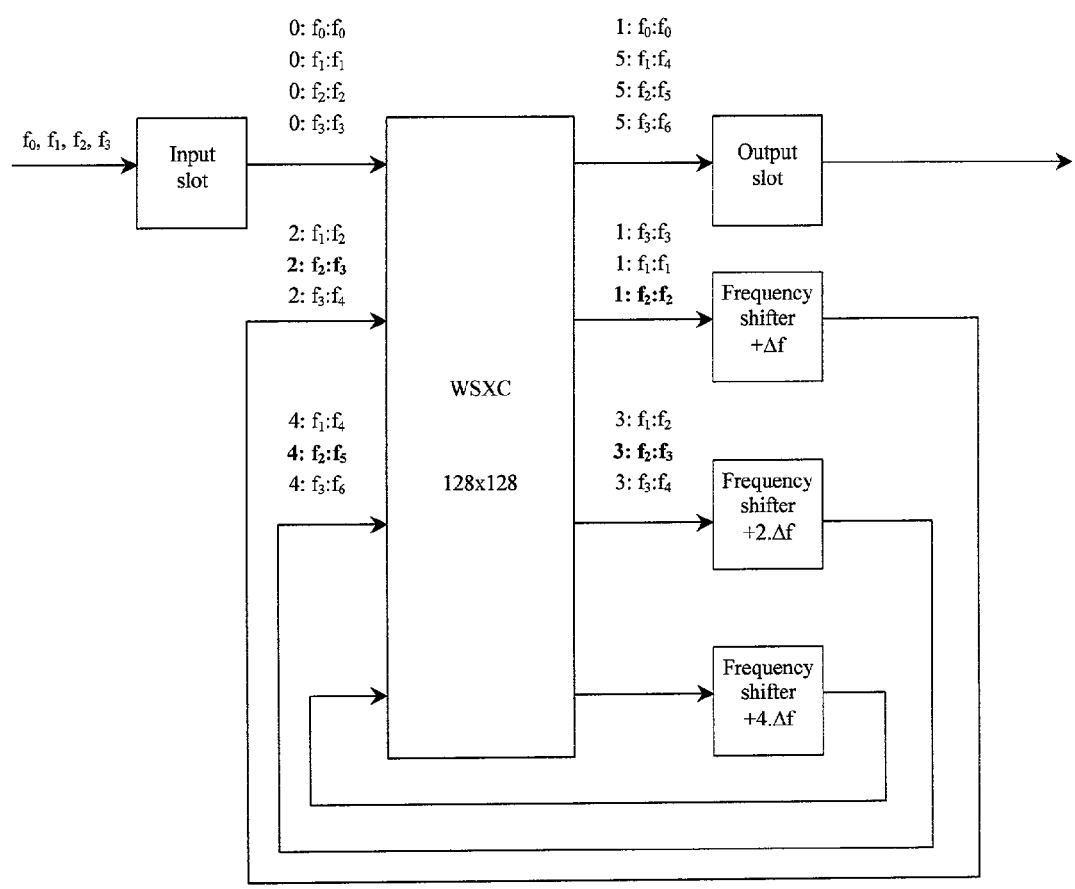
FIG. 8 shows a collision free routing and wavelength assignment solution for the logarithmic multistage wavelength converter of FIG. 6 in accordance with the present invention.

Consider the example where W=8, $\Phi_{in}=\{f_0, f_1, f_2, f_3\}$, $\Phi_{out}=\{f_0, f_4, f_5, f_6\}$ and the mapping $\Gamma$ such that $\Gamma(f_0)=f_0$, $\Gamma(f_1)=f_4$, $\Gamma(f_2)=f_5$, and $\Gamma(f_3)=f_6$. FIG. 7 shows a first routing and wavelength assignment for the mapping $\Gamma$. That is, FIG. 7 provides an accurate description of the routing and wavelength assignment algorithm by using the notation $z:f_i:f_j$, where $f_i$ is the input frequency, $f_j$ is the value to which the input frequency has been converted, up to this stage, and z represents the sequence of the operation, where the set of operations include entering or leaving a frequency shifter, leaving the input slot, as well as entering the output slot. For example, considering mapping 700, $3:f_1:f_2$ means that after the fourth operation input frequency $f_1$ has become $f_2$. In this first routing and wavelength assignment example, a collision occurs as both the channels corresponding to the input frequencies $f_1$ (700) and $f_2$ (701) enter the frequency shifter 702, with the same frequency. This collision may be removed by changing the permutation for input frequency $f_2$, as shown in FIG. 8. In FIGS. 7 and 8, a circuit-switching paradigm is assumed (i.e., there is no time-division mechanism to resolve frequency collisions).

In the generic form described in FIG. 6, logarithmic converters provide many degrees of freedom regarding the assignment of frequencies to frequency shifters. However, the hardware complexity of the central wavelength-selective cross-connect is $O(W \cdot (2N-1)^2 \log_2(W \cdot (2N-1)^2))$. The cost is large when there are hundreds of frequency channels. Some of the flexibility of generic log-converters is traded off against reduced hardware costs when log-converters are considered where the different frequency-shifting modules are assigned distinct priorities or precedence. Thus doing, priority log-converters are obtained.

B. Priority Log-Converters

Priority log-converters can implement the subset of routing and wavelength assignment policies where each frequency shifting module is assigned a distinct priority, and each input frequency visits frequency shifting modules in an order respecting the assigned priorities. For a given priority assignment, the generic architecture of FIG. 6 is transformed into that of FIG. 9. Internally, input optical frequencies are first demultiplexed into two sets named $B_0$ and $T_0$ by demultiplexer 901. Input frequencies then go through a succession of N stages, each stage being given by a block with two inputs from the previous stage and giving two outputs into the next stage. When they cross a particular stage, say stage i 906, optical frequencies that enter the stage through $B_i$ 903 are not translated, while the other frequencies that enter the stage through $T_i$ 904 are translated accordingly, in the frequency domain. Before all the frequencies are output, they are sorted into two new input sets for stage i+1, which are $B_{i+1}$ 907 and $T_{i+1}$ 905, and so on until stage N−1. The outputs of the last stage can be merged into a physical output 909 by an optional multiplexer 908.

In spite of their constraints, priority log-converters are easy to analyze and are appropriate to implement certain increasing mappings. These mappings play key roles in multi-wavelength systems.

V. Constrained Increasing Frequency Mappings

Increasing frequency mappings preserve wavelength ordering from inputs to outputs. They may be classified according to the relative position of input frequencies with respect to their image at the output as follows:

1.) When each frequency is mapped to a larger frequency, the increasing mapping is an up-conversion; and
2.) When each frequency is mapped to a smaller frequency, the increasing mapping is a down-conversion.

Some increasing mappings do not fall within any of the above-mentioned categories, when in the input frequency set some frequencies are larger than their images while others are smaller.

When an increasing frequency mapping $\Gamma$ is such that $\Gamma'(f) = \Gamma(f) - f$ is non-decreasing, it can be implemented with priority log-converters. The assignment of priorities to the different frequency shifting modules, as well as the amount of frequency shifting in each of the N consecutive stages, depends on whether the mapping is an up or a down conversion. In both cases, the key idea is to assign the precedence of the frequency shifting modules in an increasing manner with the magnitude of the frequency shift.

A. Constrained Increasing Up-Converter

A frequency mapping $\Gamma$ is implemented, for mapping a subset $\Phi_{in}$ into another frequency subset $\Phi_{out}$, such that $\Gamma$ is an increasing up-conversion. That is, it satisfies the following properties:

1.) $\Gamma$ is strictly increasing; and
2.) For each frequency f in $\Phi_{in}$, $f \leq \Gamma(f)$.

1. Additional Mapping Constraints

Assume that $\Gamma$ is upperbounded by $f_0 + (W-1) \cdot \Delta f$, that the mapping $\Gamma'$ defined by $\Gamma'(f) = \Gamma(f) - f$ is increasing, and upperbounded by $(W-1)\cdot\Delta f$. When $W=8$, an example of such a constrained mapping is $\Gamma$ from $\Phi_{in}=\{f_0, f_2, f_3\}$ into $\Phi_{out}=\{f_1, f_4, f_7\}$, such that $\Gamma(f_0)=f_1$, $\Gamma(f_2)=f_4$, and $\Gamma(f_3)=f_7$, as is proven by the following observations:

Increasing nature of $\Gamma$: $\Gamma(f_3)=f_7 > \Gamma(f_2)=f_4 > \Gamma(f_0)=f_1$;     1.)

$\Gamma$ is an up-conversion: $\Gamma(f_0)=f_1 \geq f_0$, $\Gamma(f_2)=f_4 \geq f_2$, and     2.)

$\Gamma(f_3)=f_7 \geq f_3$; and $\Gamma'(f)=\Gamma(f)-f$ is increasing:     3.)

$\Gamma(f_3)-f_3=4\cdot\Delta f > \Gamma(f_2)-f_2=2\cdot\Delta f > \Gamma(f_0)-f_0=\Delta f$.

For each frequency f in $\Phi_{in}$, it is noted that $b_{N-1}(f) \ldots b_0(f)$ the binary representation of $$\frac{1}{\Delta f}\cdot\Gamma'(f),$$

the most significant digit being $b_{N-1}(f)$.

2. Routing and Wavelength Assignments

An N stage wavelength-conversion technique is used wherein in each stage a frequency shift of the form $2^i\cdot\Delta f$ is used, where $i=0, \ldots, N-1$. The priorities are increasing based on the frequency shift provided by the stage. In other words, of two stages that provide, the first, a shift $2^i\cdot\Delta f$, and the second, a shift $2^j\cdot\Delta f$, such that $i<j$, the second has a strictly higher priority. In this scheme, for any frequency that must be shifted by $2^i\cdot\Delta f$ and by $2^j\cdot\Delta f$, such that $i<j$, there must first be a translation by $2^j\cdot\Delta f$ before the translation by $2^i\cdot\Delta f$.

Figure 9:
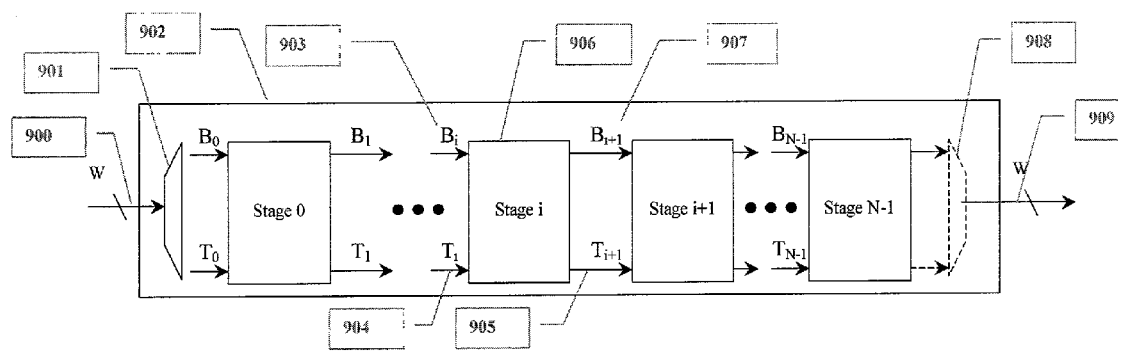
FIG. 9 shows the general architecture of a priority log-converter in accordance with the present invention.
Figure 10:
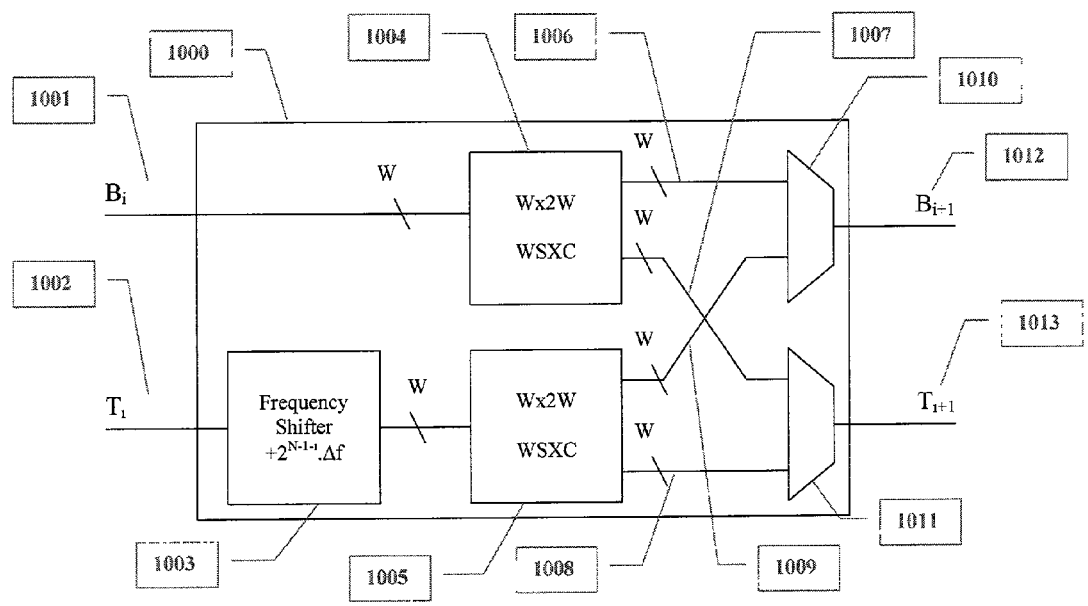
FIG. 10 shows the internal structure of stage i in the priority log-converter of FIG. 9 for a constrained increasing up-converter in accordance with the present invention.

The internal details of some stage i of the priority log-converter of FIG. 9 are represented in FIG. 10. In this stage i, the processing block 1000 takes two types of inputs, the first type corresponds to the set $B_i$ 1001 and the second type to the set $T_i$ 1002. Each of these sets may carry up to W signals at distinct frequencies. The frequencies which belong to the first input set 1001 are sent to a first W×2W wavelength-selective cross-connect (WSXC) 1004. The wavelength-selective cross-connect (WSXC) 1004 switches each frequency to one of two possible output sets, 1006 or 1007. The frequencies which belong to the second input set 1002 are sent to the frequency shifter 1003 and then sent to a second W×2W wavelength selective cross-connect (WSXC) 1005. The wavelength-selective cross-connect (WSXC) 1005 switches each frequency to one of two possible output sets, 1008 or 1009. It is important to note that, in stage i, the frequencies coming from the previous stage are processed differently according to the input path taken into the stage:

1.) Input set $B_i$: Frequencies entering stage i through $B_i$ are sent to the wavelength-selective cross-connect 1004. Frequencies that are to be left unchanged at stage i+1 are sent to output set 1006. Each such frequency can be expressed as $$f + \Delta f \cdot \sum_{j=N-1-(i-1)}^{N-1} b_j(f)\cdot 2^j,$$

for some f belonging to $\Phi_{in}$, such that $b_{N-1-i}(f)=0$ and $b_{N-1-(i+1)}(f)=0$. Frequencies that are to be changed in stage i+1 are sent to output set 1007. Each such frequency can be expressed as $$f + \Delta f \cdot \sum_{j=N-1-(i-1)}^{N-1} b_j(f)\cdot 2^j,$$

for some f belonging to $\Phi_{in}$, such that $b_{N-1-i}(f)=0$ and $b_{N-1-(i+1)}(f)=1$.

2.) Input set $T_i$: Frequencies entering stage i through $T_i$ are first up-converted by the frequency shifter 1003 that provides a frequency shift equal to $2^{N-1-i}\cdot\Delta f$. The shifted optical frequency channels are then switched to two sets of outputs by the wavelength-selective cross-connect (WSXC) 1005. A frequency is switched to output set 1009 if it is to be left unchanged in stage i+1. Each such frequency can be expressed as $$f + \Delta f \cdot \sum_{j=N-1-(i-1)}^{N-1} b_j(f)\cdot 2^j,$$

for some f belonging to $\Phi_{in}$, such that $b_{N-1-i}(f)=1$ and $b_{N-1-(i+1)}(f)=0$. A frequency is switched to output set 1008 if it is to be changed in stage i+1. Each such frequency can each be expressed as $$f + \Delta f \cdot \sum_{j=N-1-(i-1)}^{N-1} b_j(f)\cdot 2^j,$$

for some f belonging to $\Phi_{in}$, such that $b_{N-1-i}(f)=1$ and $b_{N-1-(i+1)}(f)=1$.

Multiplexer 1010 merges all frequencies to be left unchanged at the next stage (i.e., outputs 1006 and 1009) into input set $B_{i+1}$ 1012 for stage i+1, while multiplexer 1011 merges all frequencies to be shifted at the next stage (i.e., output sets 1007 and 1008) into input set $T_{i+1}$ 1013 for stage i+1.

The above assignment of frequencies in the different stages does produce the right mapping, and it has no frequency collision at any stage.

In FIG. 10, the frequency shifter 1003 is used to translate optical frequencies by a fixed amount. Such a frequency shifter may be obtained by cascading two difference frequency wave-mixers driven by different pump frequencies, as shown in FIG. 3. Using the design 1000 of FIG. 10, the stages where no frequency is shifted may be removed (i.e., any stage i may be removed such that $b_{N-1-i}(f)=0$ for any input frequency f). When difference frequency wave-mixers are used as basic components, elementary converter requirements of 2N are obtained in the worst case (i.e., at least one input frequency is shifted in any stage).

Consider again the example where $W=8$, and $\Gamma$ maps the set $\Phi_{in}=\{f_0, f_2, f_3\}$ into the set $\Phi_{out}=\{f_1, f_4, f_7\}$, such that $\Gamma(f_0)=f_1$, $\Gamma(f_2)=f_4$, and $\Gamma(f_3)=f_7$. For the different frequencies in $\Phi_{in}$, the binary representations of $$\frac{1}{\Delta f}\cdot(\Gamma(f)-f)$$

are as follows:

$$\Gamma(f_0)-f_0=\Delta f: 001 \qquad 1.)$$

$$\Gamma(f_2)-f_2=2.\Delta f: 010 \qquad 2.)$$

$$\Gamma(f_3)-f_3=4.\Delta f: 100 \qquad 3.)$$

Figure 11:
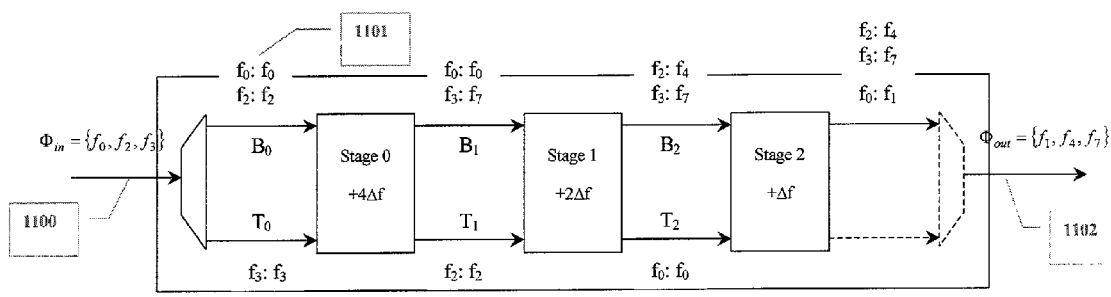
FIG. 11 shows the frequency assignments at the consecutive stages of the increasing up-converter shown in FIGS. 9 and 10 in accordance with the present invention.

In FIG. 11, the assignment of the optical frequencies at the consecutive stages of the increasing up-converter are represented for the priority log-converter shown in FIGS. 9 and 10 when W=8, and $\Gamma$ maps the set $\Phi_{in}=\{f_0, f_2, f_3\}$ into the set $\Phi_{out}=\{f_1, f_4, f_7\}$ such that $\Gamma(f_0)=f_1$, $\Gamma(f_2)=f_4$, and $\Gamma(f_3)=f_7$. That is, each 2-tuple 1101 of the form $f_i$:$f_j$ indicates that the frequency $f_i$ of the input set $\Phi_{in}$ at 1100 has been converted into $f_j$ by the previous stages of the converter. The output 1102 of the converter matches the output frequency set $\Phi_{out}=\{f_1, f_4, f_7\}$. Each of the stages in FIG. 11 is internally designed according to the structure of FIG. 10.

3. Algorithmic Description

An algorithmic description of the routing and wavelength assignment can be given as follows:
1.) Stage −1 (just before stage 0):
   For each f∈$\Phi_{in}$:
   If $b_{N-1}(f)=1$: assign f to $T_0$
   Otherwise: assign f to $B_0$
   For k=0 to N−2: set $b_k^0(f)=b_k(f)$
2.) Stage i≧0:
   For each f∈$T_i$:
   Set $\tau_i(f)=f+2^{N-1-i}.\Delta f$
   If $b_{N-1-(i+1)}^i(f)=1$: Assign $\tau_i(f)$ to $T_{i+1}$
   Otherwise: Assign $\tau_i(f)$ to $B_{i+1}$
   For each f∈$B_i$:
   Set $\tau_i(f)=f$
   If $b_{N-1-(i+1)}^i(f)=1$: Assign $\tau_i(f)$ to $T_{i+1}$
   Otherwise: Assign $\tau_i(f)$ to $B_{i+1}$
   For each f∈$T_i \cup B_i$:
   For k=0 to N−1−(i+2): set $b_k^{i+1}(\tau_i(f))=b_k^i(f)$ 4. Shift Scaling Technique It is possible to further reduce the hardware requirements of the converter when for each f belonging to $\Phi_{in}$, $\Gamma'(f)=\Gamma(f)-f$ is some multiple of $\kappa.\Delta f$ where $\kappa$ is some integer constant characteristic of the mapping $\Gamma$. In that case, the number of stages of the log-converter reduces from N to $N-\lfloor \log(\kappa) \rfloor$ in the worst case. For each frequency f in $\Phi_{in}$, let $c_{N-\lfloor log(\kappa) \rfloor -1}(f) \ldots c_0(f)$ be the binary representation of $$\frac{\Gamma'(f)}{\kappa \cdot \Delta f}.$$

Figure 12:
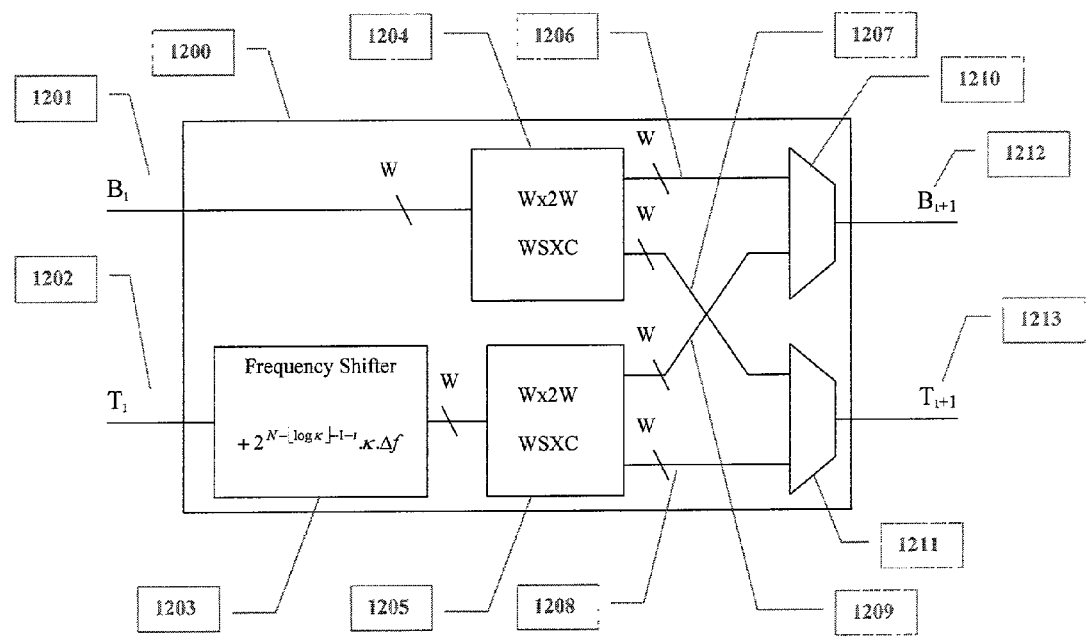
FIG. 12 shows an alternative internal structure of stage i in the priority log-converter of FIG. 9 for a constrained increasing up-converter in accordance with the present invention.

Referring to FIG. 12, there is shown an alternative internal structure 1200 of some stage i in the priority log-converter of FIG. 9 for a constrained increasing up-converter in accordance with the present invention. That is, FIG. 12 shows the internal structure of some stage i of a constrained increasing up-converter when for each f in $\Phi_{in}$, $\Gamma'(f)=\Gamma(f)-f$ is some multiple of $\kappa.\Delta f$ where $\kappa$ is some integer. In the stage i shown in FIG. 12, the frequencies are assigned as follows:
1.) Input set $B_i$: Frequencies entering stage i through $B_i$ are sent to the wavelength-selective cross-connect (WSXC) 1204. Frequencies that are to be left unchanged at stage i+1 are sent to output 1206. Each such frequency can be expressed as $$f + \kappa \cdot \Delta f \cdot \sum_{j=N-\lfloor \log(\kappa) \rfloor -1-(i-1)}^{N-\lfloor \log(\kappa) \rfloor -1} c_j(f) \cdot 2^j,$$

for some f belonging to $\Phi_{in}$, such that $c_{N-\lfloor log(\kappa) \rfloor -1-i}(f)=0$ and $c_{N-\lfloor log(\kappa) \rfloor -1-(i+1)}(f)=0$. Frequencies that are to be changed in stage i+1 are sent to output 1207. Each such frequency can be expressed as $$f + \kappa \cdot \Delta f \cdot \sum_{j=N-\lfloor \log(\kappa) \rfloor -1-(i-1)}^{N-\lfloor \log(\kappa) \rfloor -1} c_j(f) \cdot 2^j,$$

for some frequency f belonging to $\Phi_{in}$, such that $c_{N-\lfloor log(\kappa) \rfloor -1-i}(f)=0$ and $c_{N-\lfloor log(\kappa) \rfloor -1-(i+1)}(f)=1$.

2.) Input set $T_i$: Frequencies entering stage i through $T_i$ are first up-converted by wave-mixer 1203 that provides a frequency shift equal to $2^{N-\lfloor log(\kappa) \rfloor -1-i}\kappa.\Delta f$. The shifted optical frequency channels are then switched to two types of outputs by the wavelength-selective cross-connect (WSXC) 1205. A frequency is switched to output 1209 if it is to be left unchanged in stage i+1. Each such frequency can be expressed as $$f + \kappa \cdot \Delta f \cdot \sum_{j=N-\lfloor \log(\kappa) \rfloor -1-(i-1)}^{N-\lfloor \log(\kappa) \rfloor -1} c_j(f) \cdot 2^j,$$

for some frequency f belonging to $\Phi_{in}$, such that $c_{N-\lfloor log(\kappa) \rfloor -1-i}(f)=1$ and $c_{N-\lfloor log(\kappa) \rfloor -1-(i+1)}(f)=0$. A frequency is switched to output 1208 if it is to be changed in stage i+1. Each such frequency can be expressed as $$f + \kappa \cdot \Delta f \cdot \sum_{j=N-\lfloor \log(\kappa) \rfloor -1-(i-1)}^{N-\lfloor \log(\kappa) \rfloor -1} c_j(f) \cdot 2^j,$$

for some f belonging to $\Phi_{in}$, such that $c_{N-\lfloor log(\kappa) \rfloor -1-i}(f)=1$ and $c_{N-\lfloor log(\kappa) \rfloor -1-(i+1)}(f)=1$.

The design of FIG. 12 leads to a constrained increasing up-converter using at most $N-\lfloor \log(\kappa) \rfloor$ elementary frequency shifters, or $2(N-\lfloor \log(\kappa) \rfloor)$ elementary wave-mixers based on difference frequency generation.

Consider the example where W=16, and $\Gamma$ maps the set $\Phi_{in}=\{f_0, f_1, f_2\}$ into the set $\Phi_{out}=\{f_2, f_5, f_8\}$, such that $\Gamma(f_0)=f_2$, $\Gamma(f_1)=f_5$, and $\Gamma(f_2)=f_8$. It is easily checked that $\Gamma$ satisfies the constraints required to apply the design in accordance with the present invention:

Increasing nature of $\Gamma$: $\Gamma(f_2)=f_8>\Gamma(f_1)=f_5>\Gamma(f_0)=f_2$     1.)

$\Gamma$ is an up-conversion: $\Gamma(f_0)=f_2 \geq f_0$, $\Gamma(f_1)=f_5 \geq f_1$, and     2.)

$\Gamma(f_2)=f_8 \geq f_2$ $\Gamma'(f)=\Gamma(f)-f$ is increasing:     3.)

$\Gamma(f_2)-f_2=6.\Delta f > \Gamma(f_1)-f_1=4.\Delta f > \Gamma(f_0)-f_0=2.\Delta f$ For the different frequencies in $\Phi_{in}$, the binary representations of $$\frac{1}{\Delta f} \cdot (\Gamma(f) - f)$$

are as follows:

$\Gamma(f_0) - f_0 = 2.\Delta f : 010$      1.)

$\Gamma(f_1) - f_1 = 4.\Delta f : 100$      2.)

$\Gamma(f_2) - f_2 = 6.\Delta f : 110$      3.)

At this point it should be noted that $\kappa=2$ in the design of FIG. 12.

Figure 13:
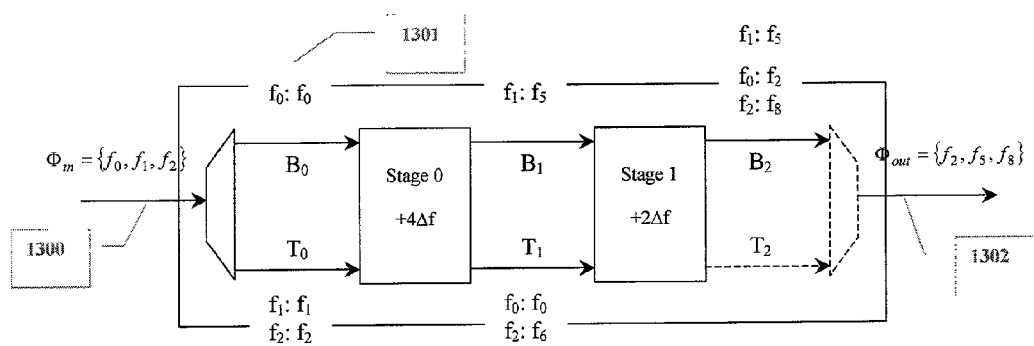
FIG. 13 shows the frequency assignments at the consecutive stages of the increasing up-converter shown in FIGS. 9 and 12 in accordance with the present invention.

In FIG. 13, the assignment of the optical frequencies at the consecutive stages of the increasing up-converter are represented for the priority log-converter shown in FIGS. 9 and 12 when W=8, and $\Gamma$ maps the set $\Phi_{in} = \{f_0, f_1, f_2\}$ into the set $\Phi_{out} = \{f_2, f_5, f_8\}$, such that $\Gamma(f_0)=f_2$, $\Gamma(f_1)=f_5$, and $\Gamma(f_2)=f_8$. That is, each 2-tuple 1301 of the form $f_i : f_j$ indicates that the frequency $f_i$ of the input set $\Phi_{in}$ at 1300 has been converted into $f_j$ by the previous stages of the converter. The output 1302 of the converter matches the output frequency set $\Phi_{out} = \{f_2, f_5, f_8\}$. Each of the stages in FIG. 13 is internally designed according to the structure of FIG. 12.

B. Constrained Increasing Down-Converter

Consider a frequency mapping $\Gamma$, from a subset $\Phi_{in}$ into another frequency subset $\Phi_{out}$, such that $\Gamma$ is an increasing down-conversion. That is, it satisfies the following properties:

1.) $\Gamma$ is increasing

2.) For each frequency f in $\Phi_{in}$, $\Gamma(f) \leq f$

1. Additional Mapping Constraints

As before, the mapping $\Gamma$ is further constrained by assuming that it is upperbounded by $f_0 + (W-1).\Delta f$, and that the mapping $\Gamma'$ defined by $\Gamma'(f) = f - \Gamma(f)$ is also increasing, and bounded above by $(W-1).\Delta f$. When W=8, an example of such a mapping is $\Gamma$ from $\Phi_{in} = \{f_1, f_4, f_7\}$ into $\Phi_{out} = \{f_0, f_2, f_3\}$, such that $\Gamma(f_1)=f_0$, $\Gamma(f_4)=f_2$, and $\Gamma(f_7)=f_3$, as is proven by the following equations:

Increasing nature of $\Gamma$: $\Gamma(f_7)=f_3>\Gamma(f_4)=f_2>\Gamma(f_1)=f_0$      1.)

$\Gamma$ is an down-conversion: $\Gamma(f_1)=f_0 \leq f_1$, $\Gamma(f_4)=f_2 \leq f_4$, and      2.)

$\Gamma(f_7)=f_3 \leq f_7$ $\Gamma'(f) = f - \Gamma(f)$ is increasing:      3.)

$f_7 - \Gamma(f_7) = 4.\Delta f > f_4 - \Gamma(f_4) = 2.\Delta f > f_1 - \Gamma(f_1) = \Delta f$ 2. Routing and Wavelength Assignments For each frequency f in $\Phi_{in}$, it is noted that $b_{N-1}(f) \ldots b_0(f)$ the binary representation of $$\frac{1}{\Delta f} \cdot \Gamma'(f).$$

Figure 14:
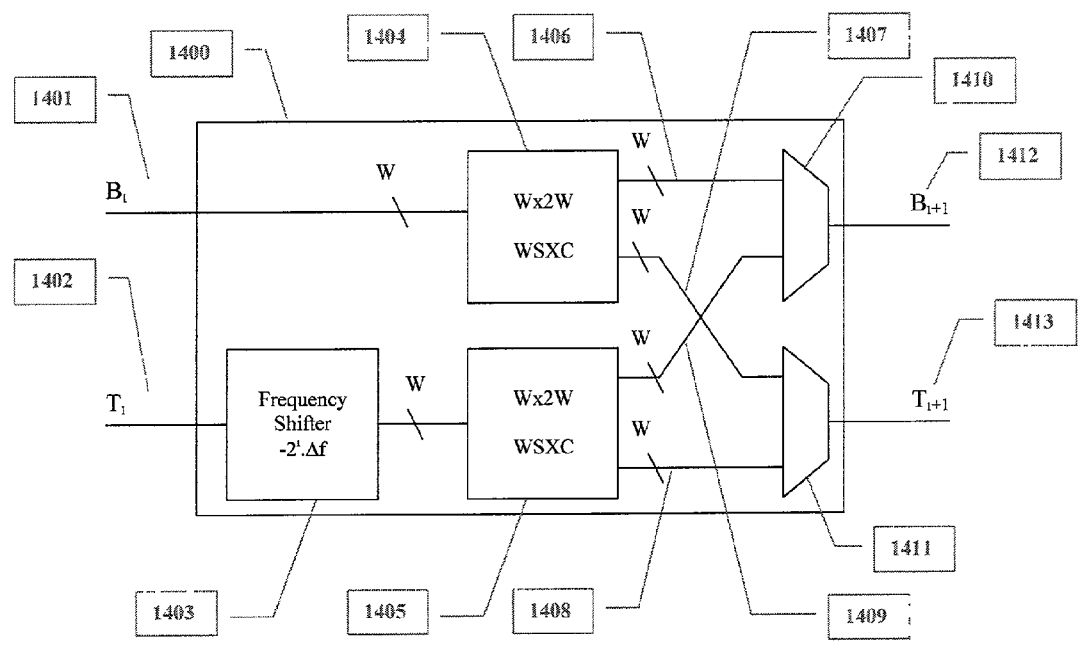
FIG. 14 shows the internal structure of stage i in the priority log-converter of FIG. 9 for a constrained increasing down-converter in accordance with the present invention.

The mapping is implemented by simply reversing the design of the constrained increasing up-converter, as described above. To be precise, N wavelength conversion stages are used. In each stage, a frequency shift of the form $-2^i.\Delta f$ is used, where i=0, ..., N−1. The priorities are increasing with the frequency shift provided by the different stages. If there are two stages that provide, the first, a shift $-2^i.\Delta f$, and the second, a shift $-2^j.\Delta f$, such that i>j, the second has a strictly higher precedence. In this scheme, for any frequency channel that must be frequency shifted by $-2^i.\Delta f$ and by $-2^j.\Delta f$, such that i>j, we must first translate it by $-2^j.\Delta f$ before translating it by $-2^i.\Delta f$. The design that results from this priority assignment is shown in FIG. 14. That is, the internal details of some stage i of the priority log-converter of FIG. 9 are represented in FIG. 14. The description of FIG. 14 is similar to that of FIG. 10.

In this stage i, the frequency processing block 1400 takes two input sets 1401 and 1402. Each of these sets may carry up to W frequencies. The frequencies which belong to the first input set 1401 are sent to a first W×2W wavelength selective cross-connect (WSXC) 1404. The wavelength-selective cross-connect (WSXC) 1404 switches each frequency to one of two possible outputs, 1406 or 1407. The frequencies which belong to the second input set 1402 are first shifted by the wave-mixer 1403 and then sent to a second W×2W wavelength selective cross-connect (WSXC) 1405. The wavelength-selective cross-connect (WSXC) 1405 switches each frequency to one of two possible outputs, 1408 or 1409. In stage i, the frequencies coming from the previous stage are processed differently according to where they enter into the stage.

1.) Input set $B_i$: Frequencies entering stage i through $B_i$ are sent to the wavelength-selective cross-connect (WSXC) 1404. Frequencies that are to be left unchanged at stage i+1 are sent to output 1406. Each such frequency can be expressed as $$f - \Delta f \cdot \sum_{j=0}^{(i-1)} b_j(f) \cdot 2^j,$$

for some f belonging to $\Phi_{in}$, such that $b_i(f)=0$ and $b_{(i+1)}(f)=0$. Frequencies that are to be changed in stage i+1 are sent to output 1407. Each such frequency can be expressed as $$f - \Delta f \cdot \sum_{j=0}^{(i-1)} b_j(f) \cdot 2^j,$$

for some f belonging to $\Phi_{in}$, such that $b_i(f)=0$ and $b_{(i+1)}(f)=1$.

2.) Input set $T_i$: Frequencies entering stage i through $T_i$ are first down-converted by wave-mixer 1403 that provides a negative frequency shift equal to $-2^i.\Delta f$. The shifted optical frequency channels are then switched to two types of outputs by the wavelength-selective cross-connect (WSXC) 1405. A frequency is switched to output 1409 if it is to be left unchanged in stage i+1. Each such frequency can be expressed as $$f - \Delta f \cdot \sum_{j=0}^{(i-1)} b_j(f) \cdot 2^j,$$

for some f belonging to $\Phi_{in}$, such that $b_i(f)=1$ and $b_{(i+1)}(f)=0$. A frequency is switched to output 1408 if it is to be changed in stage i+1. Each such frequency can each be expressed as $$f - \Delta f \cdot \sum_{j=0}^{(i-1)} b_j(f) \cdot 2^j,$$

for some f belonging to $\Phi_{in}$, such that $b_i(f)=1$ and $b_{(i+1)}(f)=1$.

Multiplexer 1410 merges all frequencies to be left unchanged at the next stage (i.e., outputs 1406 and 1409) into input set $B_{i+1}$ for stage i+1, while multiplexer 1411 merges all frequencies to be shifted at the next stage (i.e., outputs 1407 and 1408) into input set $T_{i+1}$ for stage i+1.

As with the up-counter, the down-converter may be built with N elementary frequency shifters or with 2N elementary difference frequency wave-mixers.

Figure 15:
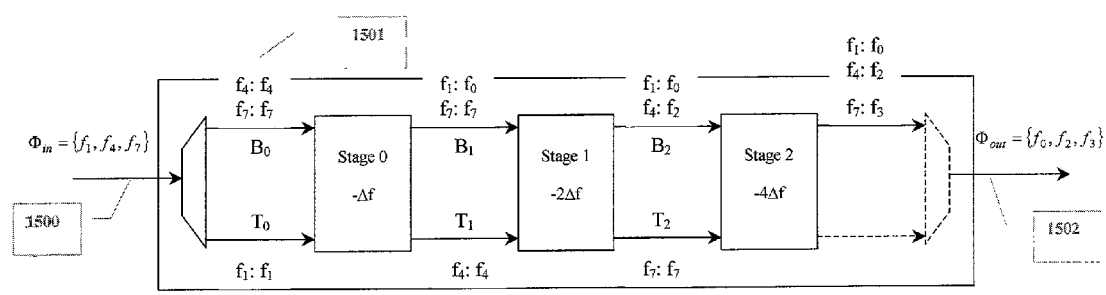
FIG. 15 shows the frequency assignments at the consecutive stages of the increasing down-converter shown in FIGS. 9 and 14 in accordance with the present invention.

In FIG. 15, the assignment of the optical frequencies at the consecutive stages of the increasing down-converter are represented for the priority log-converter shown in FIGS. 9 and 14 when W=8, and $\Gamma$ maps $\Phi_{in}=\{f_1, f_4, f_7\}$ into $\Phi_{out}=\{f_0, f_2, f_3\}$, such that $\Gamma(f_1)=f_0$, $\Gamma(f_4)=f_2$, and $\Gamma(f_7)=f_3$. That is, each 2-tuple 1501 of the form $f_i:f_j$ indicates that the frequency $f_i$ of the input set $\Phi_{in}$ at 1500 has been converted into $f_j$ by the previous stages of the converter. The output 1502 of the converter matches the output frequency set $\Phi_{out}=\{f_1, f_4, f_7\}$. Each of the stages in FIG. 15 is internally designed according to FIG. 14.

3. Algorithmic Description

An algorithmic description of the routing and frequency assignments can be given as follows:

1.) Stage −1 (just before stage 0):
   For each $f \in \Phi_{in}$:
   If $b_0(f)=1$: assign f to $T_0$
   Otherwise: assign f to $B_0$
   For k=1 to N−1: set $b_k^0(f)=b_k(f)$ 2.) Stage $i \geq 0$:
   For each $f \in T_i$:
   Set $\tau_i(f)=f-2^i \cdot \Delta f$
   If $b_{(i+1)}^i(f)=1$: Assign $\tau_i(f)$ to $T_{i+1}$
   Otherwise: Assign $\tau_i(f)$ to $B_{i+1}$
   For each $f \in B_i$:
   Set $\tau_i(f)=f$
   If $b_{(i+1)}^i(f)=1$: Assign $\tau_i(f)$ to $T_{i+1}$
   Otherwise: Assign $\tau_i(f)$ to $B_{i+1}$
   For each $f \in T_i \cup B_i$:
   For k=(i+2) to N−1, set $b_k^{i+1}(\tau_i(f))=b_k^i(f)$ 4. Shift Scaling Technique As before, it is also possible to further reduce the hardware requirements of the converter when for each f belonging to $\Phi_{in}$, $\Gamma'(f)=f-\Gamma(f)$ is some multiple of $\kappa \cdot \Delta f$ where $\kappa$ is some integer constant characteristic of the mapping $\Gamma$. In that case, the number of stages of the log-converter reduces from N to $N-\lfloor \log(\kappa) \rfloor$. For each frequency f in $\Phi_{in}$, let $c_{N-\lfloor \log(\kappa) \rfloor -1}(f) \ldots c_0(f)$ be the binary representation of $$\frac{\Gamma'(f)}{\kappa \cdot \Delta f}.$$

Figure 16:
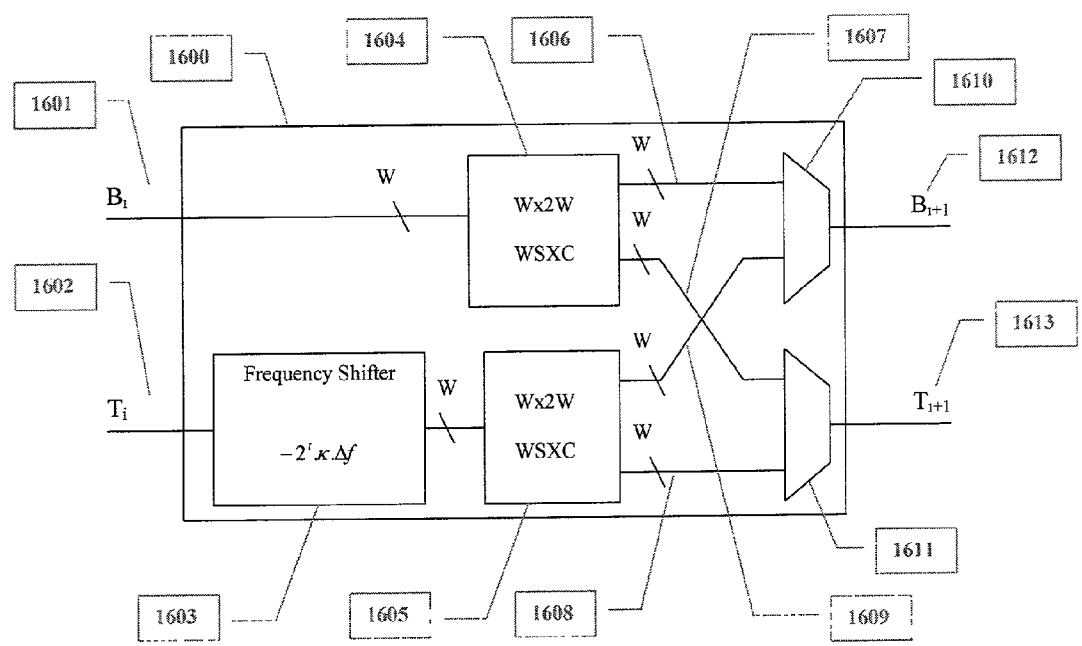
FIG. 16 shows an alternative internal structure of stage i in the priority log-converter of FIG. 9 for a constrained increasing down-converter in accordance with the present invention.

Referring to FIG. 16, there is shown an alternative internal structure 1600 of some stage i in the priority log-converter of FIG. 9 for a constrained increasing down-converter in accordance with the present invention. That is, FIG. 16 shows the internal structure of some stage i of a constrained increasing down-converter when for each f in $\Phi_{in}$, $\Gamma'(f)=f-\Gamma(f)$ is some multiple of $\kappa \cdot \Delta f$ where $\kappa$ is some integer.

In the stage i shown in FIG. 16, the frequencies are assigned as follows:

1.) Input set $B_i$: Frequencies entering stage i through $B_i$ are sent to the wavelength-selective cross-connect (WSXC) 1604. Frequencies that are to be left unchanged at stage i+1 are sent to output 1606. Each such frequency can be expressed as $$f - \kappa \cdot \Delta f \cdot \sum_{j=0}^{i-1} c_j(f) \cdot 2^j,$$

for some f belonging to $\Phi_{in}$, such that $c_i(f)=0$ and $c_{(i+1)}(f)=0$. Frequencies that are to be changed in stage i+1 are sent to output 1607. Each such frequency can be expressed as $$f - \kappa \cdot \Delta f \cdot \sum_{j=0}^{i-1} c_j(f) \cdot 2^j,$$

for some f belonging to $\Phi_{in}$, such that $c_i(f)=0$ and $c_{(i+1)}(f)=1$.

2.) Input set $T_i$: Frequencies entering stage i through $T_i$ are first down-converted by wave-mixer 1603 that provides a frequency shift equal to $-2^i \kappa \cdot \Delta f$. The shifted optical frequency channels are then switched to two types of outputs by the wavelength-selective cross-connect (WSXC) 1605. A frequency is switched to output 1609 if it is to be left unchanged in stage i+1. Each such frequency can be expressed as $$f - \kappa \cdot \Delta f \cdot \sum_{j=0}^{i-1} c_j(f) \cdot 2^j,$$

for some f belonging to $\Phi_{in}$, such that $c_i(f)=1$ and $c_{(i+1)}(f)=0$. A frequency is switched to output 1608 if it is to be changed in stage i+1. Each such frequency can each be expressed as $$f - \kappa \cdot \Delta f \cdot \sum_{j=0}^{i-1} c_j(f) \cdot 2^j,$$

for some f belonging to $\Phi_{in}$, such that $c_i(f)=1$ and $c_{(i+1)}(f)=1$.

The design of FIG. 16 leads to a constrained increasing down-converter using at most $N-\lfloor \log(\kappa) \rfloor$ elementary frequency shifters, or $2(N-\lfloor \log(\kappa) \rfloor)$ elementary wave-mixers based on difference frequency generation.

Consider the example where W=16, and $\Gamma$ maps the set $\Phi_{in}=\{f_2, f_5, f_8\}$ into the set $\Phi_{out}=\{f_0, f_1, f_2\}$, such that $\Gamma(f_2)=f_0$, $\Gamma(f_5)=f_1$, and $\Gamma(f_8)=f_2$. It is easily checked that $\Gamma$ satisfies the constraints required to apply the design in accordance with the present invention:

Increasing nature of $\Gamma$: $\Gamma(f_8)=f_2 > \Gamma(f_5)=f_1 > \Gamma(f_2)=f_0$     1.)

$\Gamma$ is an down-conversion: $\Gamma(f_2)=f_0 \leq f_2$, $\Gamma(f_5)=f_1 \leq f_5$, and
$\Gamma(f_8)=f_2 \leq f_8$     2.)

$\Gamma'(f)=-\Gamma(f)+f$ is increasing:   3.)

$f_8-\Gamma(f_8)=6.\Delta f > f_5-\Gamma(f_5)=4.\Delta f > f_2-\Gamma(f_2)=2.\Delta f$ For the different frequencies in $\Phi_{in}$, the binary representations of $$\frac{1}{\Delta f} \cdot (f - \Gamma(f))$$

are as follows:

$f_2-\Gamma(f_2)=2.\Delta f$:010   1.)

$f_5-\Gamma(f_5)=4.\Delta f$:100   2.)

$f_8-\Gamma(f_8)=6.\Delta f$:110   3.)

At this point it should be noted that κ=2 in the design of FIG. 16.

Figure 17:
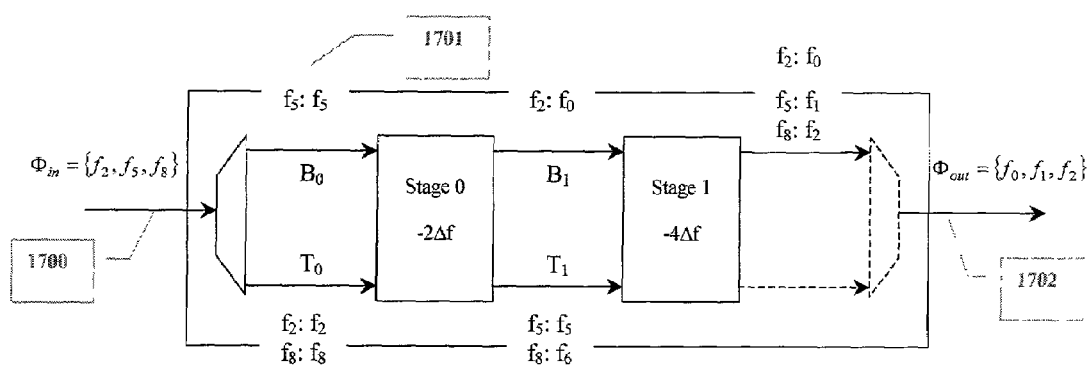
FIG. 17 shows the frequency assignments at the consecutive stages of the increasing down-converter shown in FIGS. 9 and 16 in accordance with the present invention.

In FIG. 17, the assignment of the optical frequencies at the consecutive stages of the increasing down-converter are represented for the priority log-converter shown in FIGS. 9 and 16 when W=16, and Γ maps the set $\Phi_{in}=\{f_2, f_5, f_8\}$ into the set $\Phi_{out}=\{f_0, f_1, f_2\}$, such that $\Gamma(f_2)=f_0$, $\Gamma(f_5)=f_1$, and $\Gamma(f_8)=f_2$. That is, each 2-tuple 1701 of the form $f_i:f_j$ indicates that the frequency $f_i$ of the input set $\Phi_{in}$ at 1700 has been converted into $f_j$ by the previous stages of the converter. The output 1702 of the converter matches the output frequency set $\Phi_{out}=\{f_0, f_1, f_2\}$. Each of the stages in FIG. 17 is internally designed according to the structure of FIG. 16.

VI. Application

Figure 18:
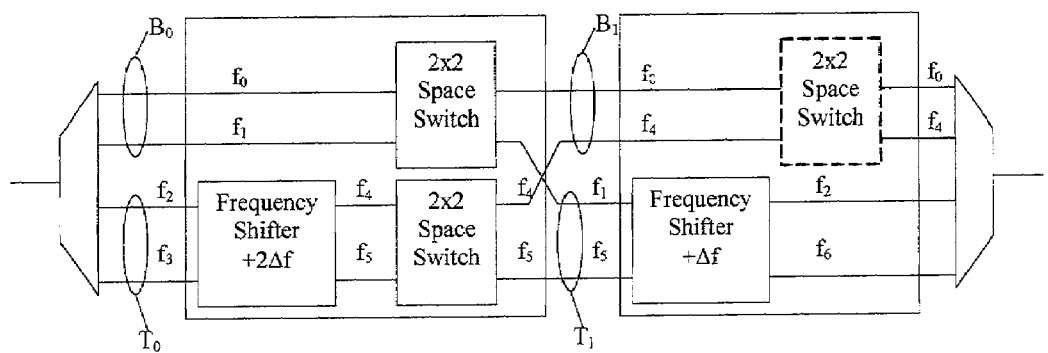
FIG. 18 shows a pseudo frequency doubler for 4 frequencies constructed in accordance with the present invention design for increasing up-converters.
Figure 19:
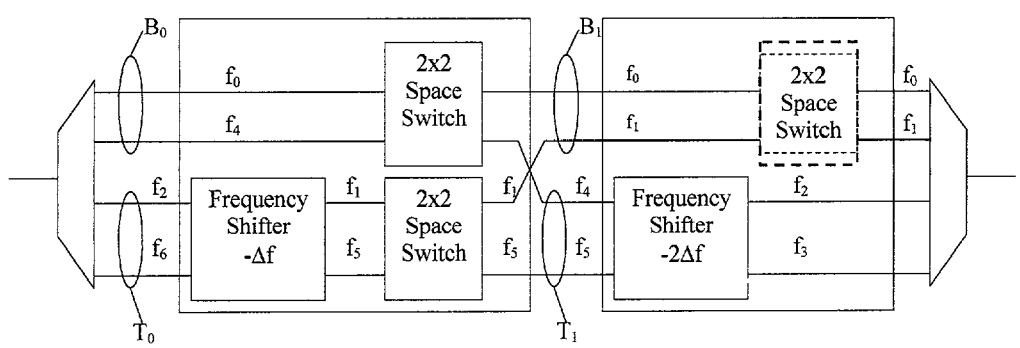
FIG. 19 shows a pseudo frequency divider for 4 frequencies constructed in accordance with the present invention design for increasing down-converters.

Pseudo-frequency multipliers or dividers can be constructed with monotonic wavelength converters. For example, FIG. 18 shows a pseudo frequency doubler constructed in accordance with the present invention design for increasing up-converters. Similarly, FIG. 19 shows a pseudo frequency divider constructed in accordance with the present invention design for increasing down-converters. Both circuits have converter requirements of the order of $O(\log_2 W)$.

In summary, all-optical wavelength conversion plays an important role in all-optical signal processing and in wavelength-switching. So far, existing techniques require a number of basic conversion devices of O(W), where W is the number of frequencies. The high costs of photonic converters often render these architectures impractical. Thus, the present invention provides new cost-efficient techniques based on bulk-wavelength-conversion in wave-mixing devices. The new architectures provide wavelength conversion in a multi-stage manner and lower requirements for elementary converters to $O(\log_2 W)$.

There are two basic principles underlying the present invention techniques. First, each input frequency is converted by routing it through $O(\log_2 W)$ consecutive stages, where each stage uses wave-mixing to provide a distinct frequency translation by $\pm 2^i.\Delta f$, $\Delta f$ being the frequency spacing between adjacent frequencies. Second, the route of each frequency is selected to avoid frequency collisions at any stage.

The present invention techniques are appropriate for multiple increasing frequency mappings such as, for example, all-optical frequency multiplications.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for optically converting wavelengths in a multi-wavelength system having W wavelength channels, wherein $W=2^N$, the method comprising the steps of:

selectively directing a received frequency channel corresponding to a respective wavelength channel based upon a predetermined frequency mapping; and shifting the frequency of the selectively directed frequency channel at least once by an amount defined by $\pm 2^i \Delta f$, wherein $\Delta f$ is a frequency spacing between adjacent frequency channels, and i=0, 1, . . . N−1.

2. The method as defined in claim 1, wherein wavelength channel ordering is preserved by only shifting the frequency of the selectively directed frequency channel to a higher frequency.

3. The method as defined in claim 2, wherein the shifting of the frequency of the selectively directed frequency channel is constrained such that the frequency of the selectively directed frequency channel is shifted at least once by an amount defined by $+2^{N-1-i}\Delta f$.

4. The method as defined in claim 3, wherein the shifting of the frequency of the selectively directed frequency channel is further constrained such that the frequency of the selectively directed frequency channel is shifted at least once by an amount defined by $+2^{N-\lfloor \log \kappa \rfloor -1-i}\kappa\Delta f$, wherein κ is an integer and i=0, . . . , N−1−$\lfloor \log_2 \kappa \rfloor$.

5. The method as defined in claim 4, wherein the amount by which the frequency of the selectively directed frequency channel is shifted decreases as the number of times the frequency of the selectively directed frequency channel is shifted increases.

6. The method as defined in claim 1, wherein wavelength channel ordering is preserved by only shifting the frequency of the selectively directed frequency channel to a lower frequency.

7. The method as defined in claim 6, wherein the shifting of the frequency of the selectively directed frequency channel is constrained such that the frequency of the selectively directed frequency channel is shifted at least once by an amount defined by $-2^i \Delta f$.

8. The method as defined in claim 7, wherein the shifting of the frequency of the selectively directed frequency channel is further constrained such that the frequency of the selectively directed frequency channel is shifted at least once by an amount defined by $-2^i \kappa \Delta f$, wherein κ is an integer and i=0, . . . , N−1−$\lfloor \log_2 \kappa \rfloor$.

9. The method as defined in claim 8, wherein the amount by which the frequency of the selectively directed frequency channel is shifted decreases as the number of times the frequency of the selectively directed frequency channel is shifted increases.

10. The method of claim 1 wherein the frequency of the selected frequency channel is shifted logarithmically.

11. The method of claim 1 wherein the frequency shift is constrained by a predetermined amount.

12. The method of claim 1 wherein the shift in frequency is based on the selectively directed frequency channel.

13. An apparatus for optically converting wavelengths in a multi-wavelength system having W wavelength channels, wherein $W=2^N$, the apparatus comprising:
- at least one switching device for selectively directing a received frequency channel corresponding to a respective wavelength channel based upon a predetermined frequency mapping; and
- at least one frequency shifter for shifting the frequency of the selectively directed frequency channel at least once by an amount defined by $\pm 2^i \Delta f$, wherein $\Delta f$ is a frequency spacing between adjacent frequency channels, and $i=0, 1, \ldots N-1$.

14. The apparatus as defined in claim 13, wherein wavelength channel ordering is preserved by only shifting the frequency of the selectively directed frequency channel to a higher frequency.

15. The apparatus as defined in claim 14, wherein the shifting of the frequency of the selectively directed frequency channel is constrained such that the frequency of the selectively directed frequency channel is shifted at least once by an amount defined by $+2^{N-1-i}\Delta f$.

16. The apparatus as defined in claim 15, wherein the shifting of the frequency of the selectively directed frequency channel is further constrained such that the frequency of the selectively directed frequency channel is shifted at least once by an amount defined by $+2^{N-\lfloor \log \kappa \rfloor -1-i}\kappa\Delta f$, wherein $\kappa$ is an integer and $i=0, \ldots, N-1-\lfloor \log_2 \kappa \rfloor$.

17. The apparatus as defined in claim 16, wherein the amount by which the frequency of the selectively directed frequency channel is shifted decreases as the number of times the frequency of the selectively directed frequency channel is shifted increases.

18. The method as defined in claim 13, wherein wavelength channel ordering is preserved by only shifting the frequency of the selectively directed frequency channel to a lower frequency.

19. The apparatus as defined in claim 18, wherein the shifting of the frequency of the selectively directed frequency channel is constrained such that the frequency of the selectively directed frequency channel is shifted at least once by an amount defined by $-2^i\Delta f$.

20. The apparatus as defined in claim 19, wherein the shifting of the frequency of the selectively directed frequency channel is further constrained such that the frequency of the selectively directed frequency channel is shifted at least once by an amount defined by $-2^i \kappa \Delta f$, wherein $\kappa$ is an integer and $i=0, \ldots, N-1-\lfloor \log_2 \kappa \rfloor$.

21. The apparatus as defined in claim 20, wherein the amount by which the frequency of the selectively directed frequency channel is shifted decreases as the number of times the frequency of the selectively directed frequency channel is shifted increases.

22. The system of claim 13 wherein the frequency of the selected frequency channel is shifted logarithmically.

23. The system of claim 13 wherein the frequency shift is constrained by a predetermined amount.

24. The system of claim 13 wherein the shift in frequency is based on the selectively directed frequency channel.

* * * * *